United States Patent [19]
Lorenz et al.

[11] Patent Number: 5,469,050
[45] Date of Patent: Nov. 21, 1995

[54] HIGH-VOLTAGE MEASUREMENT DEVICE

[75] Inventors: Dieter Lorenz; Jorg Gorablenkow, both of Berlin, Germany

[73] Assignee: Siemens Aktiengesellschaft, München, Germany

[21] Appl. No.: 240,721

[22] PCT Filed: Oct. 1, 1992

[86] PCT No.: PCT/DE92/00840

§ 371 Date: Jun. 7, 1994

§ 102(e) Date: Jun. 7, 1994

[87] PCT Pub. No.: WO93/10462

PCT Pub. Date: May 27, 1993

[30] Foreign Application Priority Data

Nov. 11, 1991 [DE] Germany ............... 41 37 865.2

[51] Int. Cl.[6] ................................................ G01R 19/00
[52] U.S. Cl. ................... 324/126; 361/605; 361/618; 218/1; 218/68
[58] Field of Search ............................ 324/126, 133; 200/144 R, 148 R, 148 B; 361/605, 612, 618

[56] References Cited

U.S. PATENT DOCUMENTS 4,424,490  1/1984  Mamet et al. .................. 324/126

FOREIGN PATENT DOCUMENTS 3409016  9/1986  Germany .
5600633  6/1978  Switzerland .

OTHER PUBLICATIONS

Fachartikel "Design and Calibration of an Universal sensor for the measurement of partial discharges and very fast transients in Gis", Sixth International Symposium of High Voltage Engineering, Aug. 28–Sep. 1, 1989, pp. 1–4.

Primary Examiner—Kenneth A. Wieder
Assistant Examiner—Kourosh Cyrus Khosravi
Attorney, Agent, or Firm—Kenyon & Kenyon

[57] ABSTRACT

A high-voltage measurement device for an electrical high-voltage switchboard plant having an measurement electrode built into an encapsulating housing, as well as an electrical conductor which conducts a measurement signal provided by the measurement electrode, connected with the electrode, and passed through the wall of the encapsulating housing in insulated manner. To protect operating personnel from high voltage which occurs at the conductor, the conductor is grounded by metal springs outside the encapsulating housing. These metal springs can be lifted up from the conductor if necessary, by means of activation elements. This is done, for example, by setting a switchboard housing onto a measurement housing which surrounds the conductor. If the switchboard housing is removed, the conductor is automatically grounded again by the metal springs. This high-voltage measurement device can be used for all types of gas-insulated high-voltage switchboard plants.

14 Claims, 1 Drawing Sheet

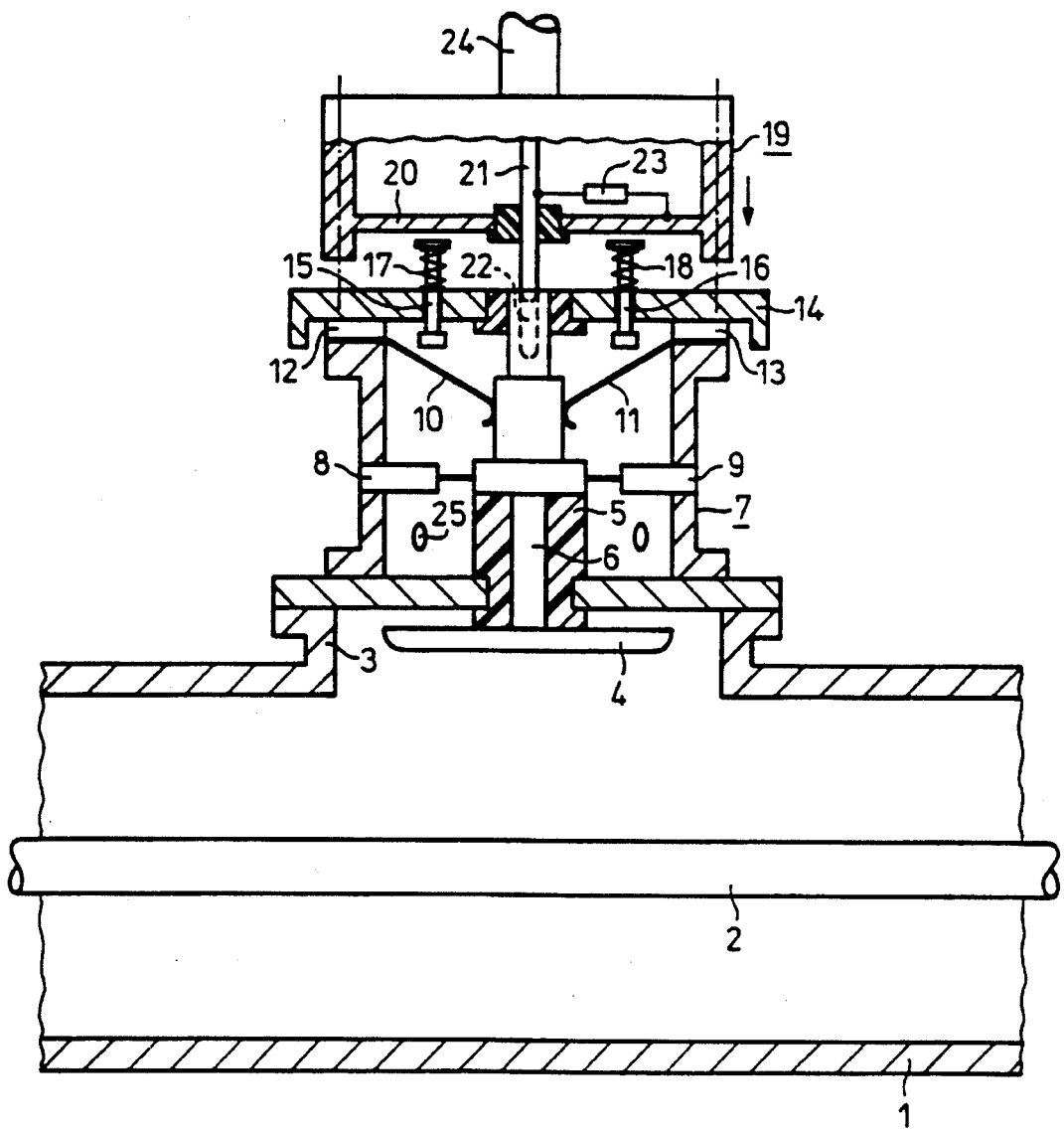

[...]

HIGH-VOLTAGE MEASUREMENT DEVICE

BACKGROUND OF THE INVENTION

The present invention relates to a high-voltage measurement device for use in an electrical high-voltage switchboard plant with an encapsulating housing. The high voltage measurement device includes a measurement electrode which extends into the encapsulating housing and an electrical conductor which conducts a measurement signal provided by the measurement electrode. The electrical conductor is connected with the measurement electrode and passes through the wall of the encapsulating housing in an insulated manner.

Such a measurement device is known, for example, from the technical article. Albiez, et al., "DESIGN AND CALIBRATION OF A UNIVERSAL SENSOR FOR THE MEASUREMENT OF PARTIAL DISCHARGES AND VERY FAST TRANSIENTS IN GIS", *SIXTH INTERNATIONAL SYMPOSIUM ON HIGH VOLTAGE ENGINEEERING,* New Orleans, La., USA, (Aug. 28– Sep. 1, 1989). In the Albiez article. for example, a measurement sensor is represented in FIG. 5, from which a conductor passes to the outside through the wall of an encapsulating housing, in insulated manner. The measurement sensor discussed in the Albiez article is used for several purposes, namely for measuring partial discharges and for measuring fast transients, with a matching external circuit in each instance.

A high-voltage measurement device for an electrical high-voltage switchboard plant with an encapsulating housing and a measurement electrode built into the latter, as well as an electrical conductor which conducts a measurement signal, connected with the electrode and passed through the wall of the encapsulating housing in insulated manner is known from the German patent publication number DE-PS 34 09 016 ("'the 016 publication").

In the 016 publication, the measurement electrode is formed by a contact spring which can be connected with the phases of bus conductors by means of a contact blade.

In normal operation of the switchboard plant described in the '016 publication, the contact spring is open so that high voltage can be capacitatively coupled out of the switching system via the conductor. The high voltage is then applied at the conductor on the outside of the encapsulating housing, and could endanger the operating personnel under certain circumstances. Only in the grounded state of the grounding switch is the contact spring, and thus also the conductor which passes through the wall of the encapsulating housing, grounded and therefore accessible without danger.

SUMMARY OF THE INVENTION

The object of the present invention is to provide a high-voltage measurement device which can be deactivated when no measurements are being made such that any operating personnel are protected from high voltages at the conductor and at the measurement device.

The present invention achieves this objective by providing a grounded spring contact which is arranged outside the encapsulating housing. The spring contact rests against the conductor to ground it when no measurement device is connected to the conductor and can be forced off from the conductor when a measurement device is connected to the conductor.

With this spring contact, the conductor is grounded in the normal state, i.e., when the spring contact is not forced off from the conductor, so that no high voltage can occur at the conductor outside the encapsulating housing. The device to process measurement signals connected to the conductor is also kept away from the influence of the high voltage, if no measurement is provided for.

In an advantageous embodiment of the present invention, a switchboard housing, which can be set onto the conductor as needed and which surrounds the device to process and/or transmit the measurement signal, is provided. This switchboard housing acts upon an activation element which lifts the spring contact away from the conductor when the switchboard housing is set onto the conductor.

By means of the activation element, the spring contact is lifted off from the conductor before the beginning of a measurement in each instance, when the switchboard housing is set onto the conductor, so that the ground connection is interrupted. The conductor can then conduct electrical signals from the interior of the encapsulating housing to the outside. After the measurement is complete, the switchboard housing can be removed from the conductor, with the spring contact automatically coming to rest against the conductor again thereby grounding it. In this way, when the switchboard housing is removed, there is no danger to the operating personnel due to the high voltage occurring at the conductor.

In another advantageous embodiment of the present invention, a switchboard housing is set onto a measurement housing which contains the contact, with the activation element comprising at least one lifting element for the spring contact which can be activated from the outside, such that the lifting element is permanently activated while the switchboard housing is set onto the measurement housing.

The measurement housing surrounds part of the conductor and the spring contact, so that the latter is protected against damage. In addition, a lifting element (i.e., activation element) for the spring contact is provided on the measurement housing. The lifting element may be a lever or pin which projects into the interior of the measurement housing. The lifting element can be activated from the outside of the measurement housing against the biasing force of a reset spring and lifts the spring contact away from the conductor when it is activated. The pin or lever consists of conductive material, so that the switchboard housing is grounded with the switchboard at the moment when the spring contact is lifted away from the conductor.

With the design of the present invention, the conductor is surrounded by a housing to protect the operating personnel, both in the lifted position and the non-lifted position, in other words in the non-grounded and the grounded state. Thus, there is no danger, even when the lifting elements are activated.

If high current reaches the measurement sensor because of an error that occurs in the switchboard plant, and this current is passed to ground via the spring contact, the spring contact can vaporize in explosive manner and the ground connection of the conductor can be abruptly interrupted. The hot gases which occur as a result of such an occurrence are retained by the measurement housing. Thus, there is no danger for the operating personnel.

In a particularly advantageous embodiment of the present invention, the device to process and/or transmit the measurement signal, can be connected with one end of the conductor via a contact plug which can be electrically coupled with a socket formed in the conductor by setting the switchboard housing onto the conductor. This design produces a conductive contact merely by setting the switchboard housing, with the device to process and/or transmit the measurement signal. onto a lid of the measurement housing which houses the conductor. If necessary, the spring contact can be lifted from the conductor at the same time, by setting down the switchboard housing onto the lid of the measurement housing. This permits very simple and safe operation of the measurement device. The measurement device can be removed when it is not needed, or it can be replaced with a switchboard housing containing a different switchboard arrangement, if different measurement procedures are planned, for example partial discharge measurements and measurements of fast transients can be conducted alternately.

In addition, in an advantageous embodiment of the present invention, the conductor is connected to the ground potential via an overvoltage suppressor. In this way, high voltages, with a potential significantly higher than that of the voltages to be measured, are passed to ground. Thus, even when the spring contact is lifted off from the conductor, the voltage is limited by the overvoltage suppressor. Any outsized current impulse which occurs in this condition will destroy the overvoltage suppressor, but will not cause any other damage, particularly to the switchboard plant.

In an advantageous embodiment of the present invention, the measurement housing has at least one blow-out opening, to permit the passage of any gases which are formed if the contact is vaporized by a high current impulse. The blow-out opening advantageously includes a deflection device for directing the gas which is expelled. This deflection device guides the gas in a direction which does not cause a hazard for the operating personnel.

The conductor and the measurement housing are structured such that various switchboard housings containing different circuit arrangements can be alternatively set onto the conductor.

In the following, the present invention will be shown in a drawing, using an embodiment, and subsequently described.

BRIEF DESCRIPTION OF THE DRAWING

The drawing shows a schematic representation of a longitudinal cross-section of an encapsulating housing with a measurement sensor, a measurement housing and a switchboard housing.

DETAILED DESCRIPTION

The FIGURE shows an encapsulating housing 1 with a centric high-voltage conductor 2. A measurement electrode 4 fits into a wall of the encapsulating housing 1 at a connection fitting 3 such that, as a whole, a dielectrically advantageous contour results. The measurement electrode 4 is connected with a conductor 6, which passes through the wall of the encapsulating housing 1 in insulated manner. For this purpose, an insulator 5 is provided, which forms a gas-tight seal with the conductor 6, on the one hand, and the wall of the encapsulating housing 1, on the other hand. A measurement housing 7 is set onto the outside of the encapsulating housing 1 and surrounds the end of the conductor 6 which projects out of the encapsulating housing 1. The measurement housing 7 is connected with the encapsulating housing 1 in conductive manner, and is at ground potential. The conductor 6 is connected with the measurement housing 7 via two overvoltage suppressors 8, 9.

Two spring contacts in the form of metal springs 10, 11 are attached to the measurement housing 7 in a conductive manner. These spring contacts 10, 11 are biased to rest against the conductor 6 and conductively couple the conductor 6 with the measurement housing 7. Blow-out openings 12, 13 are provided in the measurement housing 7 through which hot gas can escape if necessary. Such hot gas may occur, for example, when the metal springs 10, 11 are vaporized in case of an excessively high current impulse.

In the lid 14 of the measurement housing 7, two activation elements in the form of metal pins 15, 16 are arranged so they can move in the direction of the longitudinal axis of the conductor 6. Each of the activation elements 15, 16 includes an associated reset spring 17, 18. These activation elements can be moved towards the metal springs 10, 11, against the biasing force of the reset springs 17, 18, to such an extent that the biasing metal springs 10, 11 are lifted off from the conductor 6 thereby interrupting the ground contact.

The pins 17, 18 are activated when the switchboard housing 19 is set onto the measurement housing 7. That is, when the switchboard housing 19 is set onto the measurement housing 7, the base 20 of the switchboard housing 19 contacts the ends of the pins 15, 16 thereby forcing the pins 15, 16 downward against the biasing force of the reset springs 17, 18. At its base 20, the switchboard housing 19 has a contact pin 21 which extends from the outer surface of the base 20 and fits into a counter-contact (i.e., socket) 22 formed by one end of the conductor 6 when set onto the measurement housing 7. The connection between the pin 21 and socket 22 electrically couples the circuit arrangement arranged in the switchboard housing 19 and the conductor 6. This contact pin 21 is sized such that it moves into the counter-contact (socket) 22 before the metal springs 10, 11 are lifted off from the conductor 6.

For the sake of simplicity, only one resistor 23 of the circuit arrangement arranged in the switchboard housing 19 is shown in the drawing. This resistor 23 represents the outside circuit in case of a partial discharge.

If fast transient overvoltages are to be measured, it is practical to replace the resistor 23 with a capacitor which amplifies the stray capacitance of the measurement electrode 4 to the ground potential and thus the capacitance of the undervoltage capacitor formed by the measurement electrode 4 and the encapsulating housing 1.

From the switchboard housing 19, a measurement line 24 leads to other measurement devices, not shown, in which the measurement signals are processed.

In addition to the blow-out openings 12, 13, the measurement housing 7 has ventilation bores 25 which guarantee good air circulation thereby limiting humidity in the case of outdoor use.

We claim:

1. A high-voltage measurement device for an electrical high-voltage switchboard plant, the switchboard plant having an encapsulating housing with a built in measurement electrode and an electrical conductor which conducts a measurement signal produced by the measurement electrode, which is connected with the electrode, and which passes through a wall of the encapsulating housing in an insulated manner, said high-voltage measurement device comprising:

a grounded spring contact, said spring contact
arranged outside the encapsulating housing,
biased to rest against the conductor thereby grounding the conductor when no measurement device is connected to the conductor, and
adapted to be moved off from the conductor, such that it no longer contacts the conductor, when a switchboard housing is connected to a measurement housing of the high voltage measurement device.

2. The high-voltage measurement device of claim 9 further comprising:
an activation element adapted to lift the spring contact away from the conductor; and
said switchboard housing
adapted to be set onto the conductor, and
surrounding a device to process and/or transmit the measurement signal, and
being put into contact with said activation element thereby lifting the spring contact away from the conductor when the switchboard housing is set onto the conductor.

3. The high-voltage measurement device of claim 2 further comprising:
a measurement housing, the measurement housing containing said spring contact, and
containing said activation element,
wherein said activation element comprises at least one lifting element for the spring contact, wherein said at least one lifting element can be activated from the outside such that said at least one lifting element is permanently activated while said switchboard housing is set onto said measurement housing.

4. The high-voltage measurement device of claim 1 further comprising a contact plug connecting said device to process the measurement signal with said conductor when said switchboard housing is set onto said conductor.

5. The high-voltage measurement device of claim 1 further comprising an overvoltage suppressor which couples said conductor with ground.

6. The high-voltage measurement device of claim 11 wherein said measurement housing has at least one blow-out opening.

7. The high-voltage measurement device of claim 6 further comprising a deflection device at said blow-out opening for deflecting any gas which may be expelled from said measurement housing.

8. The high-voltage measurement device of claim 1 wherein said conductor is adapted to accommodate various switchboard housings containing different circuit arrangements.

9. A high-voltage measurement device for taking measurements from a conductor which is electrically coupled with a measurement electrode enclosed within an encapsulating housing which also houses a high voltage conductor, the conductor extending through a wall of the encapsulated housing in an insulated manner, said high-voltage measurement device comprising:
a) a measurement housing, said measurement housing
i) surrounding said conductor,
ii) including a spring contact, said spring contact having a first end connected to ground potential, having a second end, and being biased such that said second end is biased to contact said conductor, and
iii) including an activation element, said activation element being biased into a non-active state and having an active state in which it lifts said contact spring off from said conductor.

10. The measurement device of claim 9 further comprising:
b) a switchboard housing, said switchboard housing
i) having a connection element which can be connected with said conductor,
ii) having a surface, and
iii) adapted to be removably placed on said measurement housing,
wherein, when said switchboard housing is placed on said measurement housing, said surface contacts said activation element thereby forcing said activation element into said active state.

11. The high-voltage measurement device of claim 9 further comprising:
an activation element adapted to lift the spring contact away from the conductor; and
said switchboard housing
adapted to be set onto the conductor, and
surrounding a device to transmit the measurement signal, and
being put into contact with said activation element thereby lifting the spring contact away from the conductor when the switchboard housing is set onto the conductor.

12. The high-voltage measurement device of claim 1 further comprising:
an activation element adapted to lift the spring contact away from the conductor; and
said switchboard housing
adapted to be set onto the conductor, and
surrounding a device to process and transmit the measurement signal, and
being put into contact with said activation element thereby lifting the spring contact away from the conductor when the switchboard housing is set onto the conductor.

13. The high-voltage measurement device of claim 1 further comprising a contact plug connecting said device to transmit the measurement signal with said conductor when said switchboard housing is set onto said conductor.

14. The high-voltage measurement device of claim 1 further comprising a contact plug connecting said device to process and transmit the measurement signal with said conductor when said switchboard housing is set onto said conductor.

* * * * *